United States Patent
Clatterbuck et al.

(10) Patent No.: US 9,437,788 B2
(45) Date of Patent: Sep. 6, 2016

(54) LIGHT EMITTING DIODE (LED) COMPONENT COMPRISING A PHOSPHOR WITH IMPROVED EXCITATION PROPERTIES

(71) Applicant: Cree, Inc., Durham, NC (US)

(72) Inventors: David M. Clatterbuck, Raleigh, NC (US); Harry A. Seibel, Durham, NC (US); Douglas E. Kinkenon, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/453,878

(22) Filed: Aug. 7, 2014

(65) Prior Publication Data

US 2014/0339593 A1    Nov. 20, 2014

Related U.S. Application Data

(63) Continuation-in-part of application No. 13/719,645, filed on Dec. 19, 2012.

(51) Int. Cl.
*H01L 33/50* (2010.01)
*H01L 33/56* (2010.01)
*C09K 11/77* (2006.01)

(52) U.S. Cl.
CPC ......... *H01L 33/502* (2013.01); *C09K 11/7774* (2013.01); *H01L 33/504* (2013.01)

(58) Field of Classification Search
USPC .............. 313/498–512; 257/98; 252/301.4 R
See application file for complete search history.

(56) References Cited

U.S. PATENT DOCUMENTS

| | | | |
|---|---|---|---|
| 5,998,925 A * | 12/1999 | Shimizu | C09K 11/7767 257/103 |
| 6,600,175 B1 | 7/2003 | Baretz et al. | |
| 8,018,135 B2 | 9/2011 | Van De Ven et al. | |
| 8,232,564 B2 * | 7/2012 | Chakraborty | H01L 33/44 257/88 |
| 8,297,783 B2 * | 10/2012 | Kim | H01L 33/50 362/231 |
| 8,563,339 B2 | 10/2013 | Tarsa et al. | |
| 8,643,038 B2 | 2/2014 | Collins et al. | |
| 8,747,697 B2 | 6/2014 | Clatterbuck et al. | |
| 8,940,561 B2 | 1/2015 | Donofrio et al. | |
| 9,024,349 B2 | 5/2015 | Chitnis et al. | |
| 9,070,850 B2 | 6/2015 | Keller et al. | |
| 9,159,888 B2 | 10/2015 | Chitnis et al. | |
| 2005/0189863 A1 * | 9/2005 | Nagatomi | C09K 11/7734 313/486 |
| 2007/0221925 A1 * | 9/2007 | Aliyev | H01L 25/0753 257/79 |
| 2010/0123104 A1 | 5/2010 | Collins et al. | |
| 2012/0197599 A1 * | 8/2012 | Seibel, II | G01J 1/10 702/189 |
| 2012/0305958 A1 | 12/2012 | Seibel, II et al. | |
| 2012/0306355 A1 | 12/2012 | Seibel, II | |
| 2013/0193836 A1 | 8/2013 | Seibel, II et al. | |
| 2014/0167600 A1 | 6/2014 | Todorov et al. | |
| 2015/0083967 A1 * | 3/2015 | Watanabe | H01L 33/501 252/301.4 R |

* cited by examiner

*Primary Examiner* — Ashok Patel (74) *Attorney, Agent, or Firm* — Brinks Gilson & Lione (57) ABSTRACT

A light emitting diode (LED) component comprises an LED having a dominant wavelength in a range of from about 425 nm to less than 460 nm and a phosphor in optical communication with the LED. The phosphor includes a host lattice comprising yttrium aluminum garnet (YAG), and may include an activator comprising Ce and a substitutional dopant comprising Ga incorporated in the host lattice. An emission spectrum of the phosphor has a maximum intensity in a wavelength range of from about 540 nm to about 570 nm, and an excitation spectrum of the phosphor comprises an intensity at 440 nm equivalent to at least about 85% of a maximum intensity of the excitation spectrum.

16 Claims, 8 Drawing Sheets

LIGHT EMITTING DIODE (LED) COMPONENT COMPRISING A PHOSPHOR WITH IMPROVED EXCITATION PROPERTIES

RELATED APPLICATIONS

The present patent document is a continuation-in-part of U.S. patent application Ser. No. 13/719,645, filed on Dec. 19, 2012, published as US 2014/0167601, and hereby incorporated by reference in its entirety.

TECHNICAL FIELD

The present disclosure is related generally to phosphors for light emitting devices and more particularly to a phosphor comprising yttrium aluminum garnet (YAG) with improved excitation properties.

BACKGROUND

Light emitting diodes (LEDs) are solid state devices that convert electric energy to light, and generally comprise one or more active layers of semiconductor material sandwiched between oppositely doped layers so as to define a p-n junction. When a bias is applied across the p-n junction, holes and electrons are injected into the active layer where they recombine to generate light in a process called injection electroluminescence. Light may be emitted from the active layer through all surfaces of the LED.

As most LEDs are nearly monochromatic light sources that appear to emit light having a single color, light emitting devices or lamps including multiple LEDs that can emit light of different colors have been employed to produce white light. In these devices, the different colors of light emitted by the individual LEDs combine to produce a desired intensity and/or color of white light. For example, by simultaneously energizing red, green and blue light emitting LEDs, the resulting combined light may appear white, or nearly white.

As an alternative to combining individual LEDs to produce light emitting devices having a particular light emission spectrum, luminescent materials, or phosphors, may be used to control the color of light emitted from LEDs. A phosphor may absorb a portion of the light emitted from an LED at a given wavelength and re-emit the light at different wavelength via the principle of photoluminescence. The conversion of light having a shorter wavelength (or higher frequency) to light having a longer wavelength (or lower frequency) may be referred to as down conversion. For example, a down-converting phosphor may be combined with a blue LED to convert some of the blue wavelengths to yellow wavelengths in order to generate white light.

A widely used phosphor for white light generation is yttrium aluminum garnet (YAG), which may be doped with cerium (Ce), e.g., $Y_{3-x}Ce_xAl_5O_{12}$ or YAG:Ce. This yellow phosphor may be used in combination with a blue LED to produce white light. Compared to other phosphors based on silicates and sulfides, for example, YAG:Ce has a relatively high absorption efficiency of blue excitation radiation, a high quantum efficiency (greater than 90%), good stability in high temperature and/or high humidity environments, and a broad emission spectrum.

Figure 1:
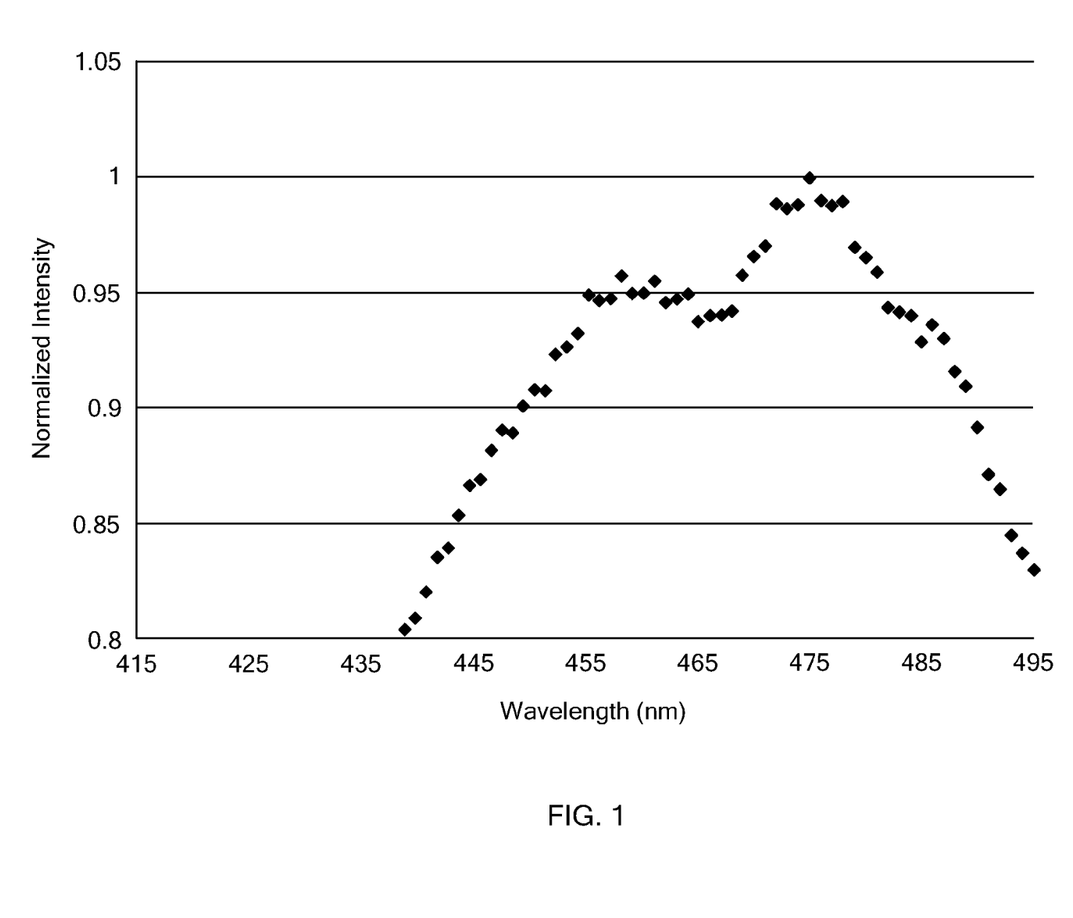
FIG. 1 shows a normalized photoluminescence (PL) excitation spectrum for a conventional YAG:Ce phosphor that does not include Ga, as measured by a fluorescence spectrophotometer.

Blue LEDs, which typically emit light over a wavelength range of 425 nm to 475 nm, may exhibit an increased radiant flux at shorter emission wavelengths (e.g., less than 460 nm). Also, the decrease in radiant flux observed at increasing temperatures may be less severe at shorter wavelengths, and the current dependence of the radiant flux tends to improve at shorter wavelengths. For these reasons it would be advantageous to employ blue LEDs that emit at shorter wavelengths in solid state light emitting devices. However, the most common yellow phosphor used in phosphor-converted LEDs, YAG:Ce, is less efficiently excited as the wavelength decreases. FIG. 1 shows a photoluminescent excitation spectrum of an exemplary YAG:Ce phosphor as measured by a fluorescence spectrophotometer. The plot shows the normalized (relative) intensity of the phosphor emission as the wavelength of the incident light is varied. The relative intensity drops from about 95% to about 80% as the wavelength decreases from about 457 nm to about 440 nm.

BRIEF SUMMARY

A phosphor with improved excitation properties includes a host lattice comprising yttrium aluminum garnet (YAG). An emission spectrum of the phosphor has a maximum intensity in a wavelength range of from about 540 nm to about 570 nm, and an excitation spectrum of the phosphor comprises an intensity at 440 nm equivalent to at least about 85% of a maximum intensity of the excitation spectrum.

A light emitting diode (LED) component comprises an LED having a dominant wavelength in a range of from about 425 nm to less than 460 nm and a phosphor in optical communication with the LED. The phosphor includes a host lattice comprising YAG. An emission spectrum of the phosphor has a maximum intensity in a wavelength range of from about 540 nm to about 570 nm, and an excitation spectrum of the phosphor comprises an intensity at 440 nm equivalent to at least about 85% of a maximum intensity of the excitation spectrum.

A method of making a phosphor having improved excitation properties comprises forming a reaction mixture including a first precursor comprising Y and a second precursor comprising Al, and heating the reaction mixture in a reducing environment at a temperature sufficient to form a phosphor comprising a host lattice comprising YAG. An emission spectrum of the phosphor comprises a maximum intensity in a wavelength range of from about 540 nm to about 570 nm, and an excitation spectrum of the phosphor comprises an intensity at 440 nm equivalent to at least about 85% of a maximum intensity of the excitation spectrum.

DETAILED DESCRIPTION

Definitions and Terminology

As used in the present disclosure, a "phosphor" or "phosphor composition" may refer to a material that absorbs light at one wavelength and re-emits the light at a different wavelength, where the re-emission includes visible light. The term phosphor may be used herein to refer to materials that are sometimes referred to as fluorescent and/or phosphorescent materials.

Also as used herein, "host lattice" refers to a crystal lattice of a given material that further includes a dopant, or "activator."

"Peak emission wavelength" refers to the wavelength of light at which the emission intensity of a phosphor or an LED is a maximum. LEDs typically have a light emission spectrum or intensity distribution that is tightly centered about the peak emission wavelength. The light emission spectrum of a phosphor or an LED may be further characterized in terms of the width of the intensity distribution measured at half the maximum light intensity (referred to as the full width at half maximum or "FWHM" width).

"Dominant wavelength" refers to the wavelength of light that has the same apparent color as the light emitted from the phosphor or LED as perceived by the human eye. Thus, the dominant wavelength differs from the peak wavelength in that the dominant wavelength takes into account the sensitivity of the human eye to different wavelengths of light.

A first device or phosphor that is described as being "in optical communication with" a second device or phosphor is positioned such that light emitted from the first device reaches the second device.

As used herein, "ccx" or "CCx" refers to correlated color X and "ccy" or "CCy" refers to correlated color y, where these coordinates (ccx, ccy) are calculated using the standard color matching functions that describe the 1931 CIE color space or chromaticity diagram.

The term "bins" or "color bins" refer to partitions of the 1931 CIE chromaticity diagram as defined by ANSI C78.377.

A "reducing environment" is an environment controlled to include substantially no oxygen and/or oxidizing gases. The reducing environment may further contain actively reducing gases.

It is understood that when an element such as a layer, region, or substrate is referred to as being "on" another element, it can be directly on the other element or intervening elements may also be present. Furthermore, relative terms such as "inner," "outer," "upper," "above," "over," "overlying," "beneath," "below," "top," "bottom," and similar terms, may be used herein to describe a relationship between elements. It is understood that these terms are intended to encompass orientations of the device that differ from those depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

The figures are intended as schematic illustrations. As such, the actual dimensions and shapes of the devices and components (e.g., layer thicknesses) can be different, and departures from the illustrations as a result of, for example, of manufacturing techniques and/or tolerances may be expected. Embodiments should not be construed as limited to the particular shapes of the regions illustrated herein but are to include deviations in shapes that result from, for example, manufacturing. A region illustrated or described as square or rectangular may have rounded or curved features due to normal manufacturing tolerances. Thus, the regions illustrated in the figures are schematic in nature and their shapes are not intended to illustrate the precise shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Description of Embodiments

Described herein are phosphor compositions and methods for shifting the excitation of a YAG phosphor to shorter wavelengths without substantially changing the emission color of the YAG phosphor (e.g., from yellow to green). Such a phosphor may be efficiently excited by a blue LED having a dominant wavelength of less than 460 nm, for example, while still emitting yellow light of the desired peak emission wavelength. The shift in the excitation spectrum of the yellow phosphor may be beneficial due to the higher radiant flux and better temperature stability achieved by shorter wavelength blue LEDs compared to those that emit at longer wavelengths. Thus, an improved LED component may be produced by combining the yellow phosphor described herein with a shorter wavelength blue LED for excitation.

To achieve the desired emission and excitation properties of the YAG phosphor, the phosphor composition is engineered to include a suitable amount of Ce and Ga, as explained below. The phosphor includes a host lattice comprising YAG and may further comprise an activator comprising Ce and a substitutional dopant comprising Ga incorporated in the host lattice. In the host lattice, Ce substitutes for Y and Ga substitutes for Al. In some embodiments, there may be an additional substitutional dopant ("ASD"; e.g., Gd and/or Tb) that also substitutes for Y. It is also possible to use In instead of Ga as a substitutional dopant for Al.

When no additional substitutional dopant is present, a mole percentage of Ce (mol. % Ce) in the host lattice may be defined as 100·(moles of Ce)/(moles of Y+moles of Ce). When an additional substitutional dopant (ASD) is present, the mol. % Ce may be defined as 100·(moles of Ce)/(moles of Y+moles of Ce+moles of ASD), and a mole percentage of ASD (mol. % ASD) in the phosphor may be defined as 100·(moles of ASD)/(moles of Y+moles of Ce+moles of ASD). Generally speaking, 0<mol. % Ce<20 and 0<mol. % ASD<30. A mole percentage of Ga (mol. % Ga) in the host lattice may be defined as 100·(moles of Ga)/(moles of Al+moles of Ga), and 0<mol. % Ga<50.

The inventors have discovered that an increased Ce concentration and/or the addition of a substitutional dopant such as Gd may be associated with a shift of the peak emission wavelength to longer wavelengths without substantially changing the excitation spectrum. Substitution of Ga for Al, on the other hand, may shift the peak emission wavelength to shorter wavelengths while also shifting the excitation spectrum to shorter wavelengths to enable the yellow phosphor to more efficiently absorb shorter wavelengths of blue light. These effects can be understood more clearly in reference to FIGS. 2 to 7, which are described below and show the effect of Ce and Ga additions on the emission and excitation spectra of exemplary yellow phosphors.

The plots of FIGS. 2-7 are generated by photoluminescence measurements made using a Hitachi F-7000 Fluorescence Spectrophotometer. Emission spectra are collected using a 450 nm excitation source, and the peak emission wavelength is measured and recorded. Excitation spectra are measured by varying the excitation wavelength while monitoring the emission intensity at the pre-determined peak emission wavelength.

Figure 2:
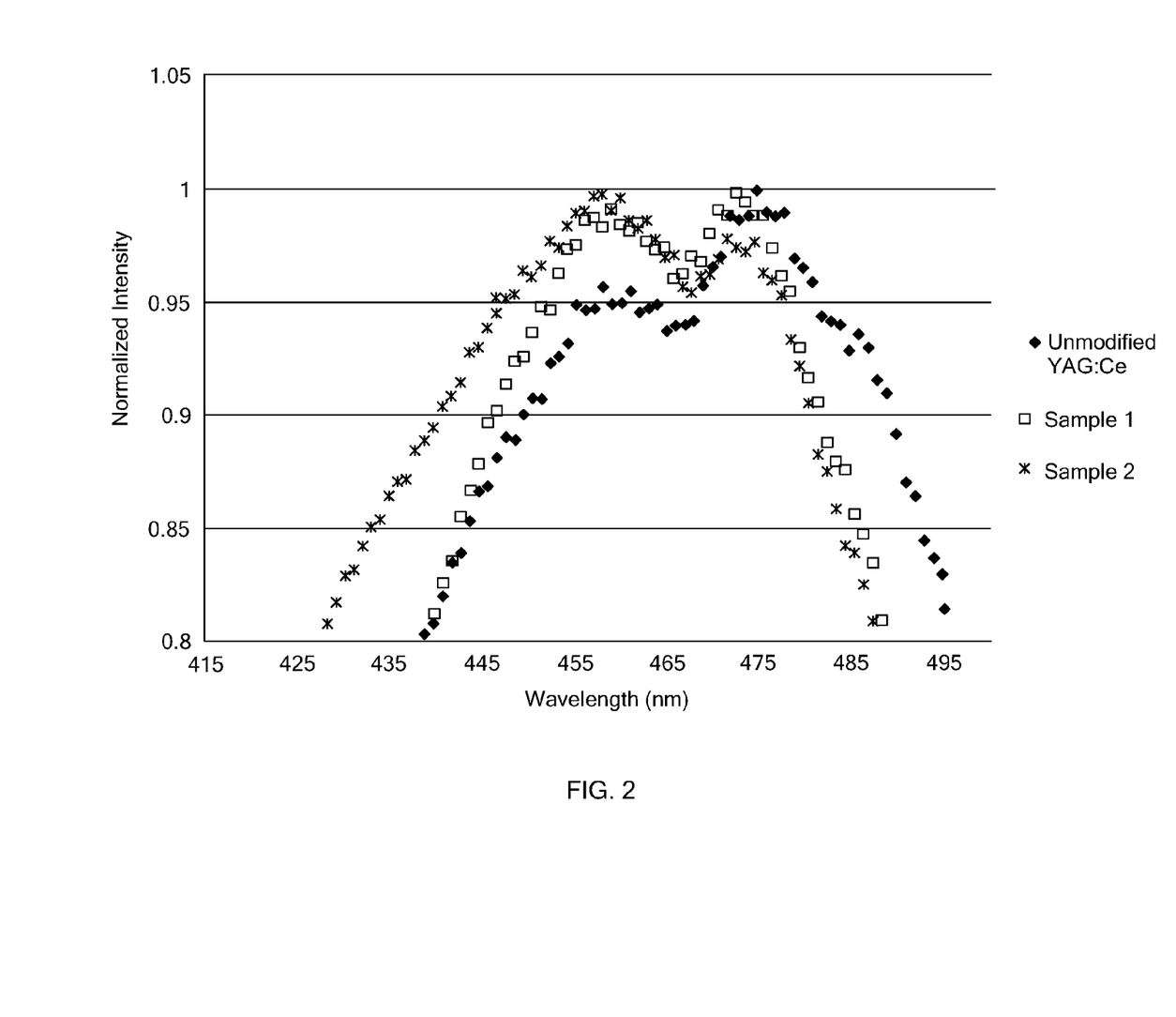
FIG. 2 shows excitation spectra for three yellow phosphor samples, including a reference sample comprising a conventional, unmodified YAG:Ce phosphor (containing no Ga), a sample ("Sample 1") comprising 2.5 mol. % Ga and 5 mol. % Ce, and another sample ("Sample 2") comprising 20 mol. % Ga and 5 mol. % Ce.

FIG. 2 shows excitation spectra for three yellow phosphor samples, including a reference sample comprising an unmodified, commercially available YAG:Ce phosphor containing no Ga, a sample ("Sample 1") comprising 2.5 mol. % Ga and 5 mol. % Ce, and another sample ("Sample 2") comprising 20 mol. % Ga and 5 mol. % Ce. Sample 2 has eight times more Ga than Sample 1 while the Ce concentration of the samples is the same. The data show that, for a given Ce concentration, increasing the Ga concentration shifts the short wavelength side of the excitation spectrum to shorter wavelengths.

Figure 3:
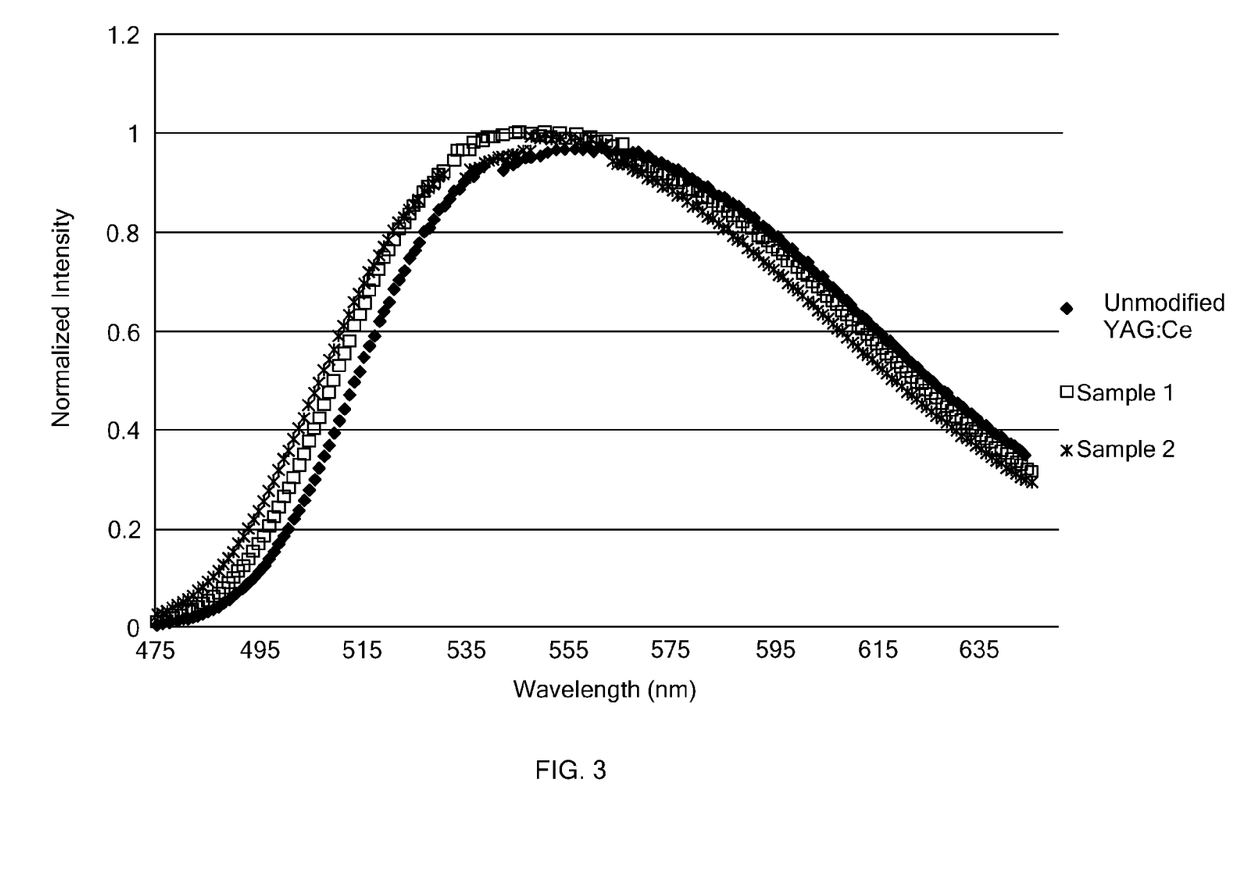
FIG. 3 shows emission spectra for the reference sample, Sample 1 and Sample 2.

FIG. 3 shows emission spectra for the reference sample, Sample 1 and Sample 2. The data show that increasing the Ga level at a given Ce concentration (in this example 5 mol. %) shifts the emission to shorter wavelengths. As above, Sample 2 contains eight times more Ga than Sample 1 (20 mol. % Ga compared to 2.5 mol. % Ga).

Figure 4:
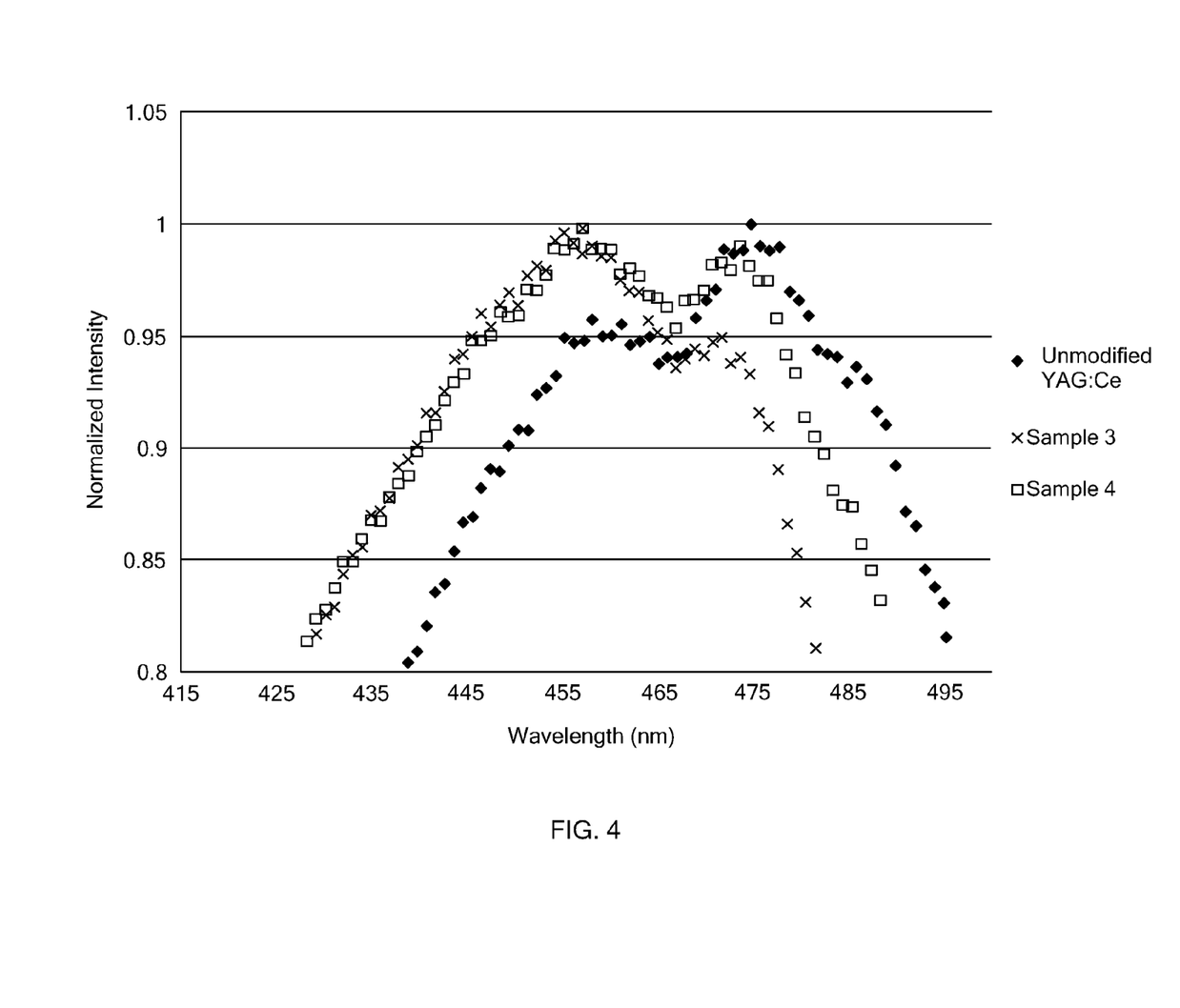
FIG. 4 shows excitation spectra for the reference sample, a sample that includes 20 mol. % Ga and 3.34 mol. % Ce ("Sample 3"), and another sample that includes 20 mol. % Ga and 12 mol. % Ce ("Sample 4")

FIG. 4 shows excitation spectra for the reference sample, Sample 3, which includes 20 mol. % Ga and 3.34 mol. % Ce, and Sample 4, which includes 20 mol. % Ga and 12 mol. % Ce. In this example, Sample 4 contains 3.6 times more Ce than Sample 3 while the samples have the same Ga concentration (20 mol. % Ga). The data indicate that, for a given Ga concentration, the short wavelength side of the excitation curve does not show a dependence on Ce level.

Figure 5:
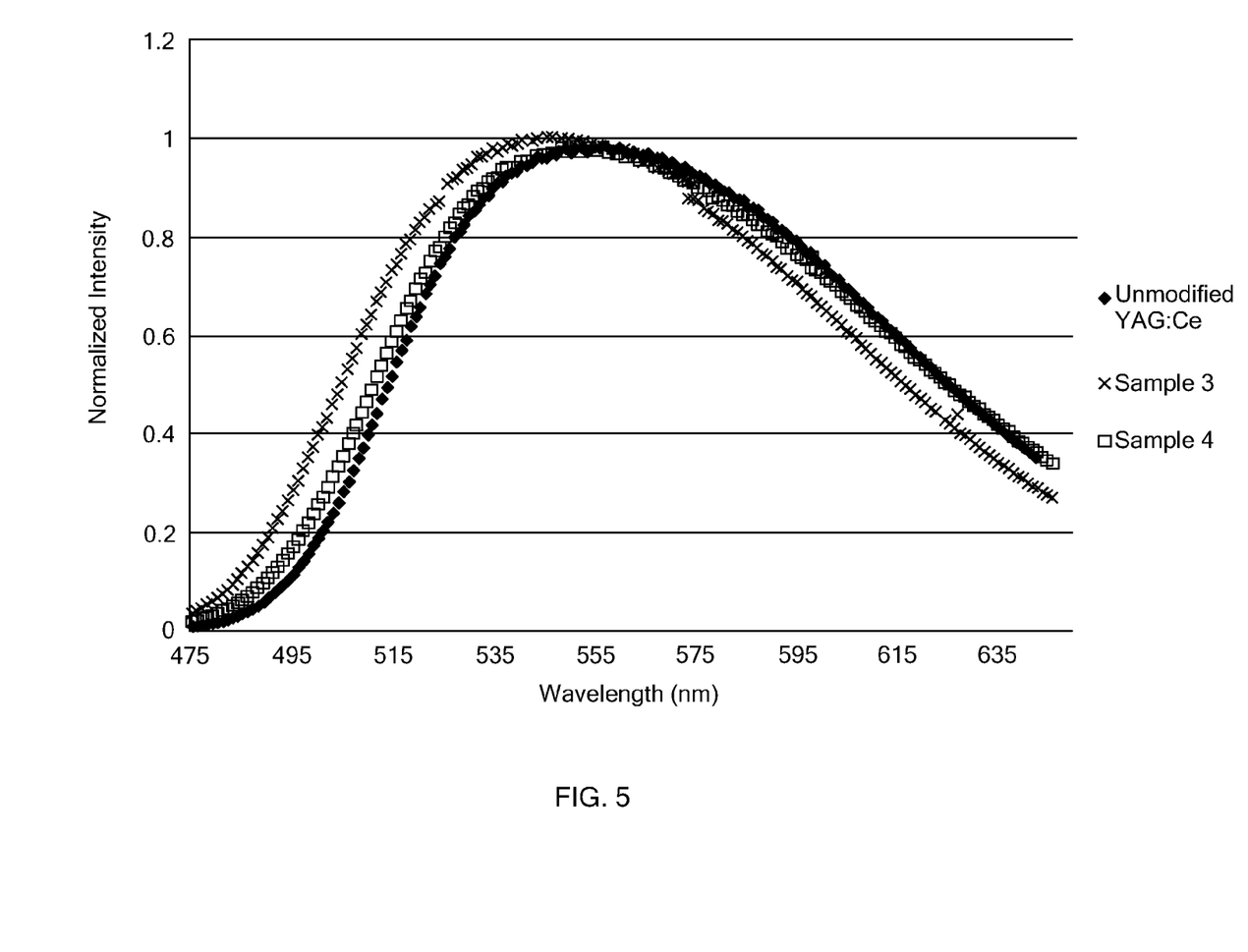
FIG. 5 shows emission spectra for the reference sample, Sample 3 and Sample 4.

FIG. 5 shows emission spectra for the reference sample, Sample 3 and Sample 4. As above, Sample 4 contains 3.6 times more Ce than Sample 3 at the same Ga concentration (20 mol. % Ga). These data indicate that, for a given Ga concentration, increasing the Ce concentration (from 3.34 mol. % Ce to 12 mol. % Ce in this example) shifts the emission to longer wavelengths.

Figure 6:
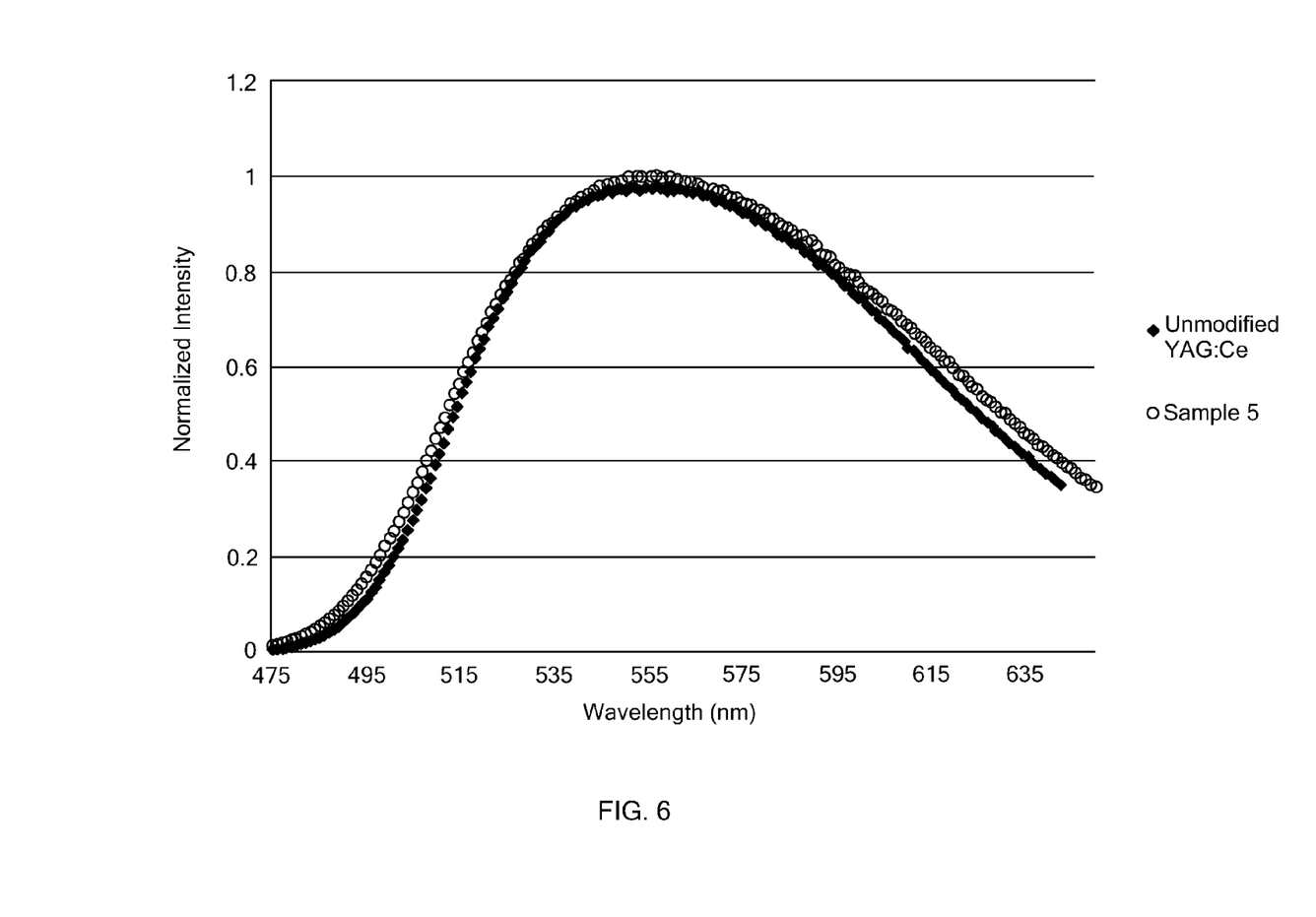
FIG. 6 shows emission spectra for the reference sample and a sample that comprises 20 mol. % Ga and 10 mol. % Ce ("Sample 5")

FIG. 6 shows emission spectra for the reference sample and Sample 5, which comprises 20 mol. % Ga and 10 mol. % Ce. As evident from the emission spectra, when the Ce and Ga concentrations of the YAG phosphor are properly adjusted, the emission of the Ce- and Ga-doped YAG phosphor may closely match the emission and thus color of an unmodified Ce-doped YAG phosphor.

Figure 7:
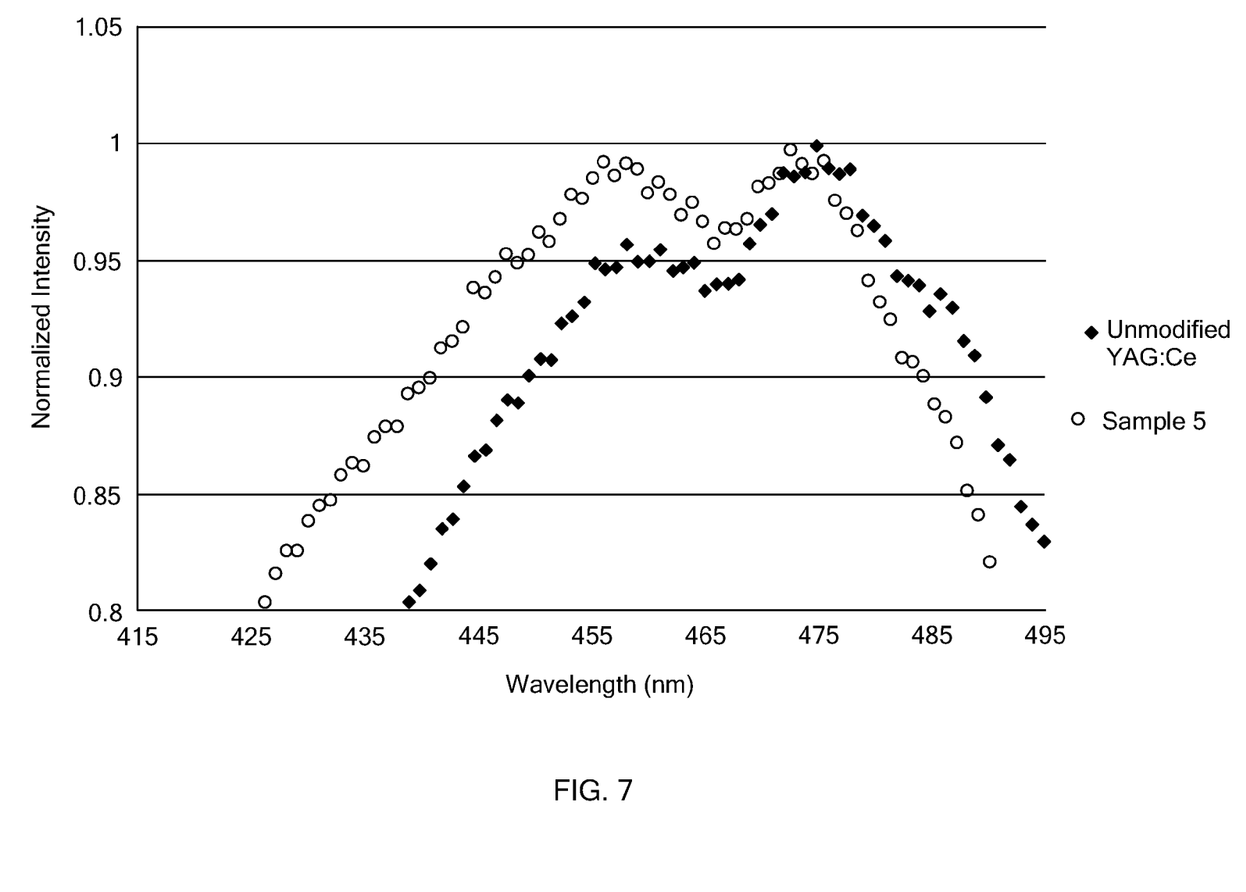
FIG. 7 shows excitation spectra for the reference sample and Sample 5.

FIG. 7 shows excitation spectra for the reference sample and Sample 5. Although Sample 5 has an emission spectrum very similar to that of the unmodified YAG:Ce reference sample, as shown in FIG. 6, the excitation spectrum is shifted to shorter wavelengths, as desired, thereby providing an advantage when used with shorter wavelength blue LEDs.

Tables 1, 2 and 3 show composition data, synthesis details and emission/excitation results from 41 exemplary samples of the yellow phosphor. The composition of the yellow phosphor may be represented by the chemical formula $Y_a Ce_b Gd_c Al_d Ga_e O_z$, where $0<a<3$, $0 \leq b \leq 0.6$, $0<c \leq 1$, $0<d<5$, $0<e \leq 2.5$, and z is nominally 12. A value of R may be defined as $R=(a+b+c)/(d+e)$.

Referring to Table 1, the exemplary yellow phosphor samples contain from 2 mol. % Ga to 20 mol. % Ga and from 1.67 mol. % Ce to 20 mol. % Ce. Each of the phosphor samples has an R value ranging from 0.57 to about 0.60. An R value of less than 0.6 is indicative of a non-stoichiometric YAG composition, where $a+b+c \neq 3$ and/or $d+e \neq 5$. In three of the phosphor samples, In is used instead of Ga at a concentration of from 1 mol. % In to 10 mol. % In.

The yellow phosphor samples were synthesized through the direct reaction of the precursor oxides $Y_2O_3$, $CeO_2$, $Al_2O_3$ and $Ga_2O_3$. Over half of the phosphor samples used $CeF_3$ in addition to $CeO_2$ as the source of cerium in the synthesis reaction, as indicated in Table 2. In those examples, the weight ratio of $CeO_2$ to $CeF_3$ was 0.87. In addition to being a cerium source, $CeF_3$ may function as a flux along with the fluoride $BaF_2$, which was used as a flux in these examples. The total amount of flux (fluorides) employed in preparing the exemplary phosphor samples ranged from 6 wt. % to 10 wt. %. The reactants were weighed out to yield $Y_a Ce_b Gd_c Al_d Ga_e O_z$, with the chemical composition, mol. % Ce, mol. % Ga and R value for each exemplary phosphor sample as provided in Table 1. The reactants were well mixed prior to firing, which involved placing each mixture in a crucible and heating to a temperature in the range of from about 1450° C. to about 1650° C. for up to 12 hours in a slightly reducing atmosphere. After firing, each phosphor sample was crushed, milled and sieved using standard methods.

After fabrication of the phosphor samples, peak emission wavelength values, photoluminescent (PL) ccx and ccy values, and excitation intensities at 440 nm were determined for each sample, as reported in Table 3.

TABLE 1

Composition Data

| Sample ID | Mol. % Ga | Mol. % Ce | R | a | b | c | d | e |
|---|---|---|---|---|---|---|---|---|
| A1 | 35 | 2 | 0.571 | 2.940 | 0.060 | 0 | 3.413 | 1.838 |
| A2 | 20 | 20 | 0.571 | 2.400 | 0.600 | 0 | 4.200 | 1.050 |
| A3 | 20 | 20 | 0.571 | 2.400 | 0.600 | 0 | 4.200 | 1.050 |
| A4 | 20 | 15 | 0.571 | 2.550 | 0.450 | 0 | 4.200 | 1.050 |

TABLE 1-continued

Composition Data

| Sample ID | Mol. % Ga | Mol. % Ce | R | a | b | c | d | e |
|---|---|---|---|---|---|---|---|---|
| A5 | 20 | 12 | 0.571 | 2.640 | 0.360 | 0 | 4.200 | 1.050 |
| A6 | 20 | 12 | 0.571 | 2.640 | 0.360 | 0 | 4.200 | 1.050 |
| 4 | 20 | 12 | 0.571 | 2.640 | 0.360 | 0 | 4.200 | 1.050 |
| 5 | 20 | 10 | 0.571 | 2.700 | 0.300 | 0 | 4.200 | 1.050 |
| A7 | 20 | 6 | 0.571 | 2.820 | 0.180 | 0 | 4.200 | 1.050 |
| A8 | 20 | 6 | 0.584 | 2.820 | 0.180 | 0 | 4.113 | 1.028 |
| A9 | 20 | 6 | 0.571 | 2.820 | 0.180 | 0 | 4.200 | 1.050 |
| 2 | 20 | 5 | 0.571 | 2.850 | 0.150 | 0 | 4.203 | 1.051 |
| 3 | 20 | 3.34 | 0.571 | 2.900 | 0.100 | 0 | 4.203 | 1.051 |
| A10 | 17 | 10 | 0.571 | 2.700 | 0.300 | 0 | 4.358 | 0.893 |
| A11 | 12 | 8 | 0.572 | 2.760 | 0.240 | 0 | 4.619 | 0.630 |
| A12 | 10 | 9 | 0.571 | 2.730 | 0.270 | 0 | 4.725 | 0.525 |
| A13 | 10 | 7 | 0.571 | 2.790 | 0.210 | 0 | 4.725 | 0.525 |
| A14 | 10 | 7 | 0.572 | 2.790 | 0.210 | 0 | 4.724 | 0.525 |
| A15 | 10 | 6.5 | 0.572 | 2.805 | 0.195 | 0 | 4.724 | 0.525 |
| A16 | 10 | 6 | 0.571 | 2.820 | 0.180 | 0 | 4.725 | 0.525 |
| A17 | 10 | 6 | 0.571 | 2.820 | 0.180 | 0 | 4.725 | 0.525 |
| A18 | 8.5 | 6 | 0.571 | 2.820 | 0.180 | 0 | 4.804 | 0.446 |
| A19 | 8.5 | 6 | 0.572 | 2.820 | 0.180 | 0 | 4.803 | 0.446 |
| A20 | 8.5 | 6 | 0.572 | 2.820 | 0.180 | 0 | 4.803 | 0.446 |
| A21 | 7.5 | 5.7 | 0.572 | 2.829 | 0.171 | 0 | 4.856 | 0.394 |
| A22 | 5 | 6 | 0.571 | 2.820 | 0.180 | 0 | 4.988 | 0.263 |
| A23 | 5 | 6 | 0.571 | 2.820 | 0.180 | 0 | 4.988 | 0.263 |
| A24 | 5 | 6 | 0.571 | 2.820 | 0.180 | 0 | 4.988 | 0.263 |
| A25 | 5 | 4.5 | 0.571 | 2.865 | 0.135 | 0 | 4.988 | 0.263 |
| A26 | 5 | 4.5 | 0.571 | 2.865 | 0.135 | 0 | 4.989 | 0.263 |
| A27 | 5 | 3.34 | 0.600 | 2.900 | 0.100 | 0 | 4.750 | 0.250 |
| A28 | 5 | 3 | 0.571 | 2.910 | 0.090 | 0 | 4.988 | 0.263 |
| A29 | 5 | 3 | 0.571 | 2.910 | 0.090 | 0 | 4.988 | 0.263 |
| A30 | 3 | 3.4 | 0.571 | 2.898 | 0.102 | 0 | 5.093 | 0.158 |
| 1 | 2.5 | 5 | 0.600 | 2.850 | 0.150 | 0 | 4.875 | 0.125 |
| A31 | 2.5 | 1.67 | 0.600 | 2.950 | 0.050 | 0 | 4.875 | 0.125 |
| A32 | 2 | 6 | 0.571 | 2.820 | 0.180 | 0 | 5.145 | 0.105 |
| A33 | 2 | 4 | 0.572 | 2.880 | 0.120 | 0 | 5.144 | 0.105 |
| A34 | 5% In | 6 | 0.571 | 2.820 | 0.180 | 0 | 4.988 | 0.263 |
| A35 | 10% In | 6 | 0.571 | 2.820 | 0.180 | 0 | 4.725 | 0.525 |
| A36 | 1% In | 6 | 0.602 | 2.820 | 0.180 | 0 | 4.937 | 0.050 |

TABLE 2

Synthesis Details

| Sample ID | Ce Source | Wt. % Fluorides |
|---|---|---|
| A1 | $CeO_2$ | 9 |
| A2 | $CeO_2/CeF_3$ | 8.5 |
| A3 | $CeO_2/CeF_3$ | 10 |
| A4 | $CeO_2/CeF_3$ | 10 |
| A5 | $CeO_2/CeF_3$ | 6 |
| A6 | $CeO_2/CeF_3$ | 10 |
| 4 | $CeO_2/CeF_3$ | 10 |
| 5 | $CeO_2/GeF_3$ | 10 |
| A7 | $CeO_2/CeF_3$ | 10 |
| A8 | $CeO_2/CeF_3$ | 10 |
| A9 | $CeO_2$ | 10 |
| 2 | $CeO_2$ | 10 |
| 3 | $CeO_2$ | 10 |
| A10 | $CeO_2/CeF_3$ | 10 |
| A11 | $CeO_2/CeF_3$ | 8.5 |
| A12 | $CeO_2$ | 10 |
| A13 | $CeO_2/CeF_3$ | 8.4 |
| A14 | $CeO_2/CeF_3$ | 8.5 |
| A15 | $CeO_2/CeF_3$ | 8.4 |
| A16 | $CeO_2/CeF_3$ | 8.5 |
| A17 | $CeO_2/CeF_3$ | 10 |
| A18 | $CeO_2/CeF_3$ | 8.5 |
| A19 | $CeO_2/CeF_3$ | 8.4 |
| A20 | $CeO_2/CeF_3$ | 8.4 |
| A21 | $CeO_2/CeF_3$ | 8.5 |
| A22 | $CeO_2/CeF_3$ | 8.5 |
| A23 | $CeO_2$ | 10 |
| A24 | $CeO_2$ | 10 |
| A25 | $CeO_2/CeF_3$ | 8.5 |
| A26 | $CeO_2/CeF_3$ | 8.4 |
| A27 | $CeO_2$ | 10 |
| A28 | $CeO_2/CeF_3$ | 8.5 |
| A29 | $CeO_2$ | 10 |
| A30 | $CeO_2/CeF_3$ | 8.5 |
| 1 | $CeO_2$ | 10 |
| A31 | $CeO_2$ | 10 |
| A32 | $CeO_2/CeF_3$ | 8.5 |
| A33 | $CeO_2/CeF_3$ | 7.6 |
| A34 | $CeO_2$ | 10 |
| A35 | $CeO_2$ | 10 |
| A36 | $CeO_2$ | 10 |

TABLE 3

Emission and Excitation Results

| Sample ID | Peak Emission Wavelength (nm) | PL ccx | PL ccy | Excitation Intensity at 440 nm/Max Excitation Intensity |
|---|---|---|---|---|
| A1 | 532 | 0.374 | 0.565 | 0.947 |
| A2 | 563 | 0.464 | 0.520 | 0.877 |
| A3 | 559 | 0.460 | 0.524 | 0.865 |
| A4 | 559 | 0.447 | 0.532 | 0.901 |
| A5 | 559 | 0.446 | 0.530 | 0.903 |
| A6 | 556 | 0.452 | 0.529 | 0.899 |
| 4 | 553 | 0.439 | 0.537 | 0.904 |
| 5 | 557 | 0.443 | 0.534 | 0.899 |
| A7 | 552 | 0.436 | 0.540 | 0.913 |
| A8 | 547 | 0.428 | 0.545 | 0.910 |
| A9 | 546 | 0.417 | 0.550 | 0.912 |
| 2 | 550 | 0.422 | 0.548 | 0.908 |
| 3 | 550 | 0.414 | 0.551 | 0.915 |
| A10 | 554 | 0.447 | 0.532 | 0.888 |
| A11 | 557 | 0.443 | 0.536 | 0.901 |
| A12 | 546 | 0.432 | 0.543 | 0.875 |
| A13 | 559 | 0.448 | 0.533 | 0.886 |
| A14 | 559 | 0.457 | 0.526 | 0.862 |
| A15 | 553 | 0.440 | 0.538 | 0.864 |
| A16 | 559 | 0.444 | 0.535 | 0.857 |
| A17 | 547 | 0.428 | 0.545 | 0.879 |
| A18 | 558 | 0.456 | 0.527 | 0.867 |
| A19 | 558 | 0.449 | 0.533 | 0.857 |
| A20 | 553 | 0.434 | 0.542 | 0.844 |
| A21 | 557 | 0.455 | 0.528 | 0.851 |
| A22 | 560 | 0.457 | 0.527 | 0.833 |
| A23 | 552 | 0.441 | 0.538 | 0.843 |
| A24 | 551 | 0.438 | 0.540 | 0.849 |
| A25 | 559 | 0.451 | 0.532 | 0.845 |
| A26 | 555 | 0.448 | 0.533 | 0.842 |
| A27 | 546 | 0.421 | 0.550 | 0.840 |
| A28 | 550 | 0.438 | 0.539 | 0.847 |
| A29 | 547 | 0.430 | 0.545 | 0.848 |
| A30 | 559 | 0.451 | 0.532 | 0.838 |
| 1 | 547 | 0.432 | 0.544 | 0.823 |
| A31 | 539 | 0.417 | 0.552 | 0.793 |
| A32 | 564 | 0.466 | 0.521 | 0.826 |
| A33 | 557 | 0.453 | 0.530 | 0.827 |
| A34 | 557 | 0.439 | 0.537 | 0.798 |
| A35 | 557 | 0.437 | 0.534 | 0.687 |
| A36 | 553 | 0.444 | 0.536 | 0.829 |

Referring to Table 3, the improved phosphor, which may comprise a host lattice comprising YAG and an activator comprising Ce and a substitutional dopant comprising Ga incorporated in the host lattice, may have an emission spectrum comprising a maximum intensity in a wavelength range of from about 540 nm to about 570 nm and an excitation spectrum comprising an intensity at 440 nm equivalent to at least about 85% of a maximum intensity of the excitation spectrum. Advantageously, the intensity at 440 nm may be equivalent at least about 90% of the maximum intensity of the excitation. Also, it is preferred that the maximum intensity of the emission spectrum (or the peak emission wavelength of the phosphor) falls in a wavelength range of from about 550 nm to about 560 nm, and in some embodiments, the maximum intensity may lie in a wavelength range of from about 555 nm to about 560 nm. The phosphor may have a ccx value of from about 0.42 to about 0.46, or from about 0.44 to about 0.45, and a ccy value of from about 0.53 to about 0.54.

A phosphor exhibiting the above emission and excitation characteristics may emit the desired yellow color while efficiently absorbing short wavelengths of blue light.

As set forth above, the composition of the yellow phosphor may be represented by the chemical formula $Y_a Ce_b Gd_c Al_d Ga_e O_z$, where $0<a<3$, $0<b\leq 0.6$, $0\leq c\leq 1$, $0<d<5$, $0<e\leq 2.5$, z is nominally 12, and where $R=(a+b+c)/(d+e)$.

It may be advantageous for b to be at least about 0.1, at least about 0.2, or at least about 0.3. In some examples, b may be about 0.6 or less, or about 0.5 or less. For example, preferred ranges for b may include $0.1\leq b\leq 0.6$, or $0.2\leq b\leq 0.5$. In some embodiments, c=0.

In addition, it may be preferable for e to be at least about 0.3, at least about 0.6, or at least about 0.9. In some cases, e may be about 2.5 or less, or about 2 or less, about 1.5 or less, or about 1.1 or less. For example, suitable ranges for e may include one or more of the following: $0.3\leq e\leq 2.5$, $0.5\leq e\leq 2$, $0.6\leq e\leq 1.5$.

Typically, $0.5\leq R\leq 0.6$, or $0.5\leq R<0.6$. To achieve this, $a+b\leq 3$ and $d+e\geq 5$. For example, $d+e>5$, or $d+e\geq 5.2$. In some embodiments, $a+b=3$.

The mol. % Ce may be calculated as $b/(a+b+c)\cdot 100$, where, as indicated above, 0<mol. % Ce<20. Preferably, 3≤mol. % Ce≤20, or 3.3≤mol. % Ce≤15. The mol. % Ga may be calculated as $e/(d+e)\cdot 100$, where, as indicated above, 0<mol. % Ga<50, and where Ga may alternatively be substituted with In. Preferably, 5≤mol. % Ga≤50, 12≤mol. % Ga≤50, 5≤mol. % Ga≤20, or 12≤mol. % Ga≤20.

Typically, the desired emission and excitation spectra are achieved when the ratio of the mol. % Ga to the mol. % Ce is at least 1:1 (i.e., mol. % Ga≤mol. % Ce). For example, mol. % Ga≤1.3·mol. % Ce, mol. % Ga≤1.7·mol. % Ce, mol. % Ga≤2·mol. % Ce, mol. % Ga≤3·mol. % Ce, or mol. % Ga≤4·mol. % Ce.

Figure 8:
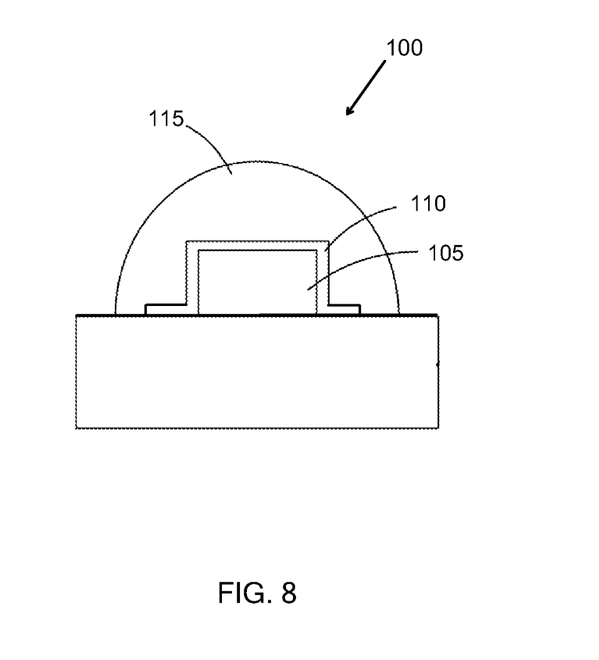
FIG. 8 shows a schematic of an exemplary LED component comprising a blue LED and a yellow phosphor in optical communication with the blue LED.

An LED component that includes the yellow phosphor as set forth above is also described herein. Referring now to FIG. 8, a light emitting diode (LED) component 100 may comprise (a) a blue LED 105 having a dominant wavelength in a range of from about 425 nm to less than 460 nm and (b) a yellow phosphor 110 in optical communication with the blue LED 105, where the yellow phosphor 110 includes a host lattice comprising yttrium aluminum garnet (YAG) and may include an activator comprising Ce and a substitutional dopant comprising Ga incorporated in the host lattice. Advantageously, an emission spectrum of the yellow phosphor comprises a maximum intensity in a wavelength range of from about 540 nm to about 570 nm, and more preferably from about 550 nm to about 560 nm. In addition, an excitation spectrum of the yellow phosphor comprises an intensity at 440 nm equivalent to at least about 90% of a maximum intensity of the excitation spectrum. In some embodiments, the intensity at 440 nm may be equivalent to at least about 95% of a maximum intensity of the excitation spectrum.

As described above, Ce substitutes for Y and Ga substitutes for Al in the host lattice of the yellow phosphor. In some embodiments, there may be an additional substitutional dopant ("ASD"; e.g., Gd) that also substitutes for Y. It is also possible to use In instead of Ga as a substitutional dopant for Al. An increased Ce concentration and/or the addition of a substitutional dopant such as Gd may be associated with a shift of the peak emission wavelength to longer wavelengths without substantially changing the excitation spectrum, as shown previously. Substitution of Ga for Al, on the other hand, may shift the peak emission wavelength to shorter wavelengths, while also shifting the excitation spectrum to shorter wavelengths to enable the yellow phosphor to more efficiently absorb shorter wavelengths of blue light. The yellow phosphor included in the LED component may have any of the compositions, characteristics and/or properties described in this disclosure that facilitate achieving the desired emission and excitation spectra.

Because the improved yellow phosphor absorbs more efficiently at shorter blue wavelengths, the LED component including the yellow phosphor may comprise a blue LED with a shorter dominant wavelength than the blue LEDs used in conventional LED components. For example, the blue LED may have a dominant wavelength in the range of about 425 nm to about 455 nm, from about 435 nm to about 450 nm, or from about 435 nm to about 445 nm. The blue LED shown schematically in FIG. 8 may be a Group III nitride-based LED formed from nitrogen and Group III elements such as aluminum, gallium and/or indium in the form of nitride layers epitaxially grown and doped as known in the art to produce a blue LED that may preferentially emit blue light at wavelengths below 460 nm. The blue LED and LED components containing the blue LED may be fabricated using methods known in the art.

The LED component 100 may further include other phosphors in addition to the improved yellow phosphor 110. For example, the LED component may include a red phosphor, such as a nitride phosphor (e.g., $(Ca,Sr)AlSiN_3$:Eu, as set forth for example in U.S. Patent Application Publication 2010/0123104, entitled "Phosphor Composition," which is hereby incorporated by reference). One or more additional phosphors (red, green, etc.) may be mixed with the yellow phosphor and/or positioned separately, such as in discrete layers with a single type of phosphor in each layer. The phosphor(s) may be coated directly on one or more surfaces of the blue LED 105, as illustrated for example in FIG. 8. The phosphor(s) may also or alternatively be positioned remotely, such as on or within a lens or optic 115 of the LED component 100. Phosphor layer(s) applied directly to the blue LED may be disposed on any or all surfaces of the LED, including the sidewalls and/or top surface, and the layer(s) may also extend onto the submount, as shown in FIG. 8. In one example, a first phosphor layer applied to the blue LED 105 or overlying lens 115 may include a yellow phosphor, a second phosphor layer above or below the first layer may include a red phosphor, etc. In some embodiments, the phosphor(s) may be processed to form a pellet or disc and positioned in a remote location with respect to the blue LED. The phosphor(s) may be mixed with a binder (e.g., a silicone encapsulant) prior to use. Deposition of the phosphor(s) may entail spray coating or another suitable method, such as one of the deposition techniques described in the following patent publications: U.S. Pat. No. 8,232,564 entitled "Wafer Level Phosphor Coating Method and Devices Fabricated Utilizing Method," U.S. Patent Application Publication No. 2010/0155763 entitled "Systems and Methods for Application of Optical Materials to Optical Elements," and U.S. Patent Application Publication No. 2008/0179611 entitled "Wafer Level Phosphor Coating Method and Devices Fabricated Utilizing Method," which are hereby incorporated by reference in their entirety.

A method of making the yellow phosphor that may exhibit the desired excitation and emission spectra may involve combining one or more Ce-containing precursors with a Y-containing precursor, an Al-containing precursor, a Ga-containing precursor, and optionally a Gd-containing precursor. The mixture of precursors undergoes a reaction in a reducing environment to yield the yellow phosphor. The reaction may include solid-state (solid-phase) and/or liquid-phase diffusion.

The one or more Ce-containing precursors may include a first precursor comprising cerium and oxygen and a second precursor comprising cerium and fluorine. For example, the first precursor may comprise $CeO_2$ and the second precursor may comprise $CeF_3$. In other cases, only one Ce-containing precursor may be employed, such as $CeO_2$, which is also a source of oxygen. Other cerium and oxygen precursors that may suitable for the reaction include, for example, cerium nitrate, cerium carbonate, and/or cerium sulfate.

As set forth in U.S. Patent Application Publication 2014/0167600, when $CeF_3$ is used in combination with $CeO_2$ in the reaction mixture, a yellow phosphor with a longer wavelength emission may be achieved. It is believed that the enhanced yellow color may be enabled by an increase in the Ce content of the YAG host lattice, which in turn is facilitated by the combination of $CeF_3$ with $CeO_2$ during the reaction.

In some embodiments, a 1:1 weight ratio (50 wt. %:50 wt. %) of the $CeO_2$ and $CeF_3$ precursors may be employed in the reaction mixture. Other weight ratios of $CeO_2$ to $CeF_3$, including weight ratios greater than 1 or weight ratios less than 1, may also be suitable. For example, the weight ratio may be about 0.9 or less, about 0.8 or less, or 0.7 or less. Alternatively, the weight ratio may be at least about 1, at least about 1.2, or at least about 1.4. Typically, the weight ratio is at least about 0.5 and no greater than about 2.5.

The Ga-containing precursor is typically $Ga_2O_3$ but may also or alternatively be selected from among Ga-containing hydroxides, sulfates, nitrates, carbonates or fluorides. The Y-containing precursor in the reaction mixture may comprise $Y_2O_3$ and/or $YF_3$ powder. The Al-containing precursor may comprise $Al_2O_3$ (alumina) and/or Al $F_3$ powder. For example, $\gamma$-$Al_2O_3$ (or $\gamma$-phase $Al_2O_3$) powder may be used. The optional Gd-containing precursor is typically $Gd_2O_3$ but may also or alternatively be selected from among Gd-containing hydroxides, sulfates, nitrates, carbonates, fluorides or oxalates. A commercial source of the precursor powders is Alfa Aesar Inc. of Ward Hill, Mass.

The precursor powders may have a median (d50) particle size in the range of from about 1 micron to about 25 microns, from about 4 microns to about 14 microns, or from about 5 microns to about 10 microns. Any of the precursor powders may be mechanically milled or otherwise processed (e.g., by jet milling) in order to reduce the average particle size of the powder before adding the precursor to the reaction mixture. The precursor powders may be milled using a commercially available jet milling apparatus, which utilizes high pressure air to break up larger particles into smaller particles. In one example, the median (d50) particle size of the alumina precursor powder employed in the reaction mixture may be about microns or lower, or about 3 microns or lower, or about 1 micron or lower. For example, the $Al_2O_3$ precursor powder (which may be $\gamma$-$Al_2O_3$ powder that has been mechanically milled) may have a median particle size in the range of from about 1 micron to about 3 microns.

One or more fluorine containing compounds (e.g., $AlF_3$, $YF_3$, $CeF_3$, $GaF_3$, $GdF_3$, LiF, NaF, KF, RbF, $MgF_2$, $CaF_2$, and/or $BaF_2$) may be employed as a flux during the reaction to reduce the reaction temperature and facilitate formation of the YAG:Ce phosphor. Generally, the flux may be present in the reaction mixture at a concentration of up to about 10 wt. %. For example, the concentration of the flux may be at least about 4 wt. %, at least about 5 wt. %, at least about 6 wt. %, or at least about 8 wt. %. Preferably, a total amount of fluoride(s) in the reaction mixture is from about 5 wt. % to about 10 wt. %.

The reducing environment in which the reaction mixture is heated may include a forming gas. Nitrogen gas ($N_2$) and optionally hydrogen gas ($H_2$) may be present in the forming gas. For example, the forming gas may be a mixture of nitrogen gas and hydrogen gas including up to about 10% $H_2$, or up to about 5% $H_2$. Typically, a mixture of about 95% $N_2$ and about 5% $H_2$ is suitable to obtain the desired yellow phosphor powder. In some examples, the forming gas may be entirely hydrogen (e.g., up to 100% $H_2$). The reaction may be carried out in a chamber comprising an outer vessel and lid and containing a crucible for holding the precursors. The crucible may be made of one or more refractory materials, such as a ceramic or a refractory metal. For example, the crucible may comprise $Al_2O_3$. During the reaction, the forming gas may be flowed continuously through the chamber.

The reaction typically occurs at a temperature of at least about 1400° C. For example, the precursors may be heated to a temperature in the range of from about 1400° C. to about 1700° C., or in the range of from about 1450° C. to about 1650° C. A heating rate of from about 50° C./h to about 500° C./h, 300° C./h to about 400° C./h, or about 350° C./h may be used to heat the precursors to the reaction temperature. The dwell time at the reaction temperature is generally about 12 hours or less, and typically at least about 0.1 hour. For example, the dwell time may be from about 0.1 hour to about 12 hours, from about 0.1 hour to about 6 hours, or from about 1 hour to about 5 hours.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A phosphor with improved excitation properties, the phosphor comprising:
   a host lattice comprising yttrium aluminum garnet (YAG); and
   an activator comprising Ce and a substitutional dopant comprising Ga incorporated in the host lattice,
   wherein the phosphor comprises a chemical formula $Y_aCe_bGd_cAl_dGa_eO_z$, where $0<a<3$, $0<b\leq0.6$, $0\leq c\leq1$, $0<d<5$, $0<e\leq2.5$, and z is nominally 12,
   wherein $R=(a+b+c)/(d+e)$, and $0.5\leq R<0.6$, and wherein an emission spectrum of the phosphor comprises a maximum intensity in a wavelength range of from about 540 nm to about 570 nm.

2. The phosphor of claim 1, wherein the maximum intensity of the emission spectrum is in the wavelength range of from about 550 nm to about 560 nm.

3. The phosphor of claim 1, wherein an excitation spectrum of the phosphor comprises an intensity at 440 nm equivalent to at least about 85% of a maximum intensity of the excitation spectrum.

4. The phosphor of claim 1, wherein $c=0$ and $0.1 \le b \le 0.6$.

5. The phosphor of claim 1, wherein $0.3 \le e \le 2.5$.

6. The phosphor of claim 1, wherein
$b/(a+b+c) \cdot 100 =$ mol. % Ce, and $3 <$ mol. % Ce $< 20$,
$e/(d+e) \cdot 100 =$ mol. % Ga, and $5 <$ mol. % Ga $< 50$, and
wherein mol. % Ga mol. % Ce.

7. The phosphor of claim 6, wherein $3.3 \le$ mol. % Ce $< 15$ and $12 \le$ mol. % Ga $< 20$.

8. The phosphor of claim 1, wherein $d+e > 5$ and $a+b=3$.

9. A light emitting diode (LED) component comprising:
an LED comprising a dominant wavelength in a range of from about 425 nm to less than 460 nm;
a phosphor in optical communication with the LED, the phosphor comprising: a host lattice comprising yttrium aluminum garnet (YAG); and an activator comprising Ce and a substitutional dopant comprising Ga incorporated in the host lattice,
wherein the phosphor comprises a chemical formula $Y_aCe_bGd_cAl_dGa_eO_z$, where $0<a<3$, $0<b\le0.6$, $0\le c\le1$, $0<d<5$, $0<e\le2.5$, and z is nominally 12,
wherein an emission spectrum of the phosphor comprises a maximum intensity in a wavelength range of from about 540 nm to about 570 nm, and
wherein an excitation spectrum of the phosphor comprises an intensity at 440 nm equivalent to at least about 85% of a maximum intensity of the excitation spectrum.

10. The LED component of claim 9, wherein $R=(a+b+c)/(d+e)$, and $0.5 \le R < 0.6$.

11. The LED component of claim 10, wherein $d+e>5$ and $a+b=3$.

12. The LED component of claim 9, wherein the maximum intensity of the emission spectrum is in the wavelength range of from about 550 nm to about 560 nm.

13. The LED component of claim 9, wherein the intensity at 440 nm is equivalent to at least about 90% of the maximum intensity of the excitation spectrum.

14. The LED component of claim 9, wherein the phosphor comprises a ccx value of from about 0.44 to about 0.45 and a ccy value of from about 0.53 to about 0.54.

15. The LED component of claim 9, wherein
$b/(a+b+c) \cdot 100 =$ mol. % Ce, and $3 <$ mol. % Ce $< 20$,
$e/(d+e) \cdot 100 =$ mol. % Ga, and $5 <$ mol. % Ga $< 50$, and
wherein mol. % Ga mol. % Ce.

16. The LED component of claim 15, wherein 3.3 mol. % Ce $< 15$ and $12 \le$ mol. % Ga $< 20$.

* * * * *

UNITED STATES PATENT AND TRADEMARK OFFICE
CERTIFICATE OF CORRECTION

PATENT NO.        : 9,437,788 B2                                        Page 1 of 1
APPLICATION NO.   : 14/453878
DATED             : September 6, 2016
INVENTOR(S)       : Clatterbuck et al.

It is certified that error appears in the above-identified patent and that said Letters Patent is hereby corrected as shown below:

In the Claims

Column 13, Claim 6, Line 16, after "wherein mol. %" replace "Ga mol." with --Ga $\geq$ mol.--.

Column 14, Claim 15, Line 26, after "wherein mol. %" replace "Ga mol." with --Ga $\geq$ mol.--.

Column 14, Claim 16, Line 27, after "of claim 15, wherein" replace "3.3 mol. %" with --3.3 $\leq$ mol. %--.

Signed and Sealed this
Third Day of January, 2017

Michelle K. Lee
*Director of the United States Patent and Trademark Office*